(12) United States Patent
Ito et al.

(10) Patent No.: US 7,108,923 B1
(45) Date of Patent: Sep. 19, 2006

(54) COPPER FOIL FOR PRINTED CIRCUIT BOARD WITH TAKING ENVIRONMENTAL CONSERVATION INTO CONSIDERATION

(75) Inventors: Yasuyuki Ito, Tsuchiura (JP); Katsuyuki Matsumoto, Hitachi (JP); Kenji Yokomizo, Taito (JP); Yasuhiro Kusano, Inashiki-gun (JP); Shinichiro Shimizu, Abiko (JP); Muneo Kodaira, Tsuchiura (JP); Katsumi Nomura, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 11/247,297

(22) Filed: Oct. 12, 2005

(30) Foreign Application Priority Data

May 16, 2005 (JP) ............................. 2005-143273

(51) Int. Cl.
*B32B 15/00* (2006.01)
*B32B 15/04* (2006.01)
*B32B 15/20* (2006.01)

(52) U.S. Cl. ...................... 428/675; 428/674; 428/658; 428/666; 428/341; 428/607; 428/447; 428/450

(58) Field of Classification Search ................ 428/632, 428/658, 666, 667, 674, 675, 678, 219, 340, 428/341, 447, 448, 457, 450, 606, 607
See application file for complete search history.

(56) References Cited

U.S. PATENT DOCUMENTS 6,132,589 A * 10/2000 Ameen et al. .............. 205/177

FOREIGN PATENT DOCUMENTS

| JP | 52-145769 | 12/1977 |
| JP | 06-54829 | 7/1994 |
| JP | 3142259 | 12/2000 |
| JP | 2005-008972 | 1/2005 |
| JP | 2005-042139 | * 2/2005 |
| WO | WO 97/04627 | * 2/1997 |

* cited by examiner

*Primary Examiner*—Michael E. Lavilla
(74) *Attorney, Agent, or Firm*—McGinn IP Law Group, PLLC (57) ABSTRACT

A copper foil for a printed circuit board has a rust preventing layer formed by a trivalent chromium chemical conversion treatment on a surface of the copper foil that the copper foil is bonded to a base material for the printed circuit board. T copper foil is of copper or copper alloy, and the rust preventing layer contains 0.5 to 2.5 μg/cm² of chromium converted into metallic chromium.

10 Claims, 3 Drawing Sheets

COPPER FOIL FOR PRINTED CIRCUIT BOARD WITH TAKING ENVIRONMENTAL CONSERVATION INTO CONSIDERATION

The present application is based on Japanese patent application No. 2005-143273, the entire contents of which are incorporated herein by reference.

BACKGROUND OF THE INVENTION

1. Field of the Invention

The present invention relates to a copper foil for printed circuit board with taking environmental conservation into consideration, and more particularly to a copper foil for printed circuit board with taking environmental conservation into consideration which does not contain hexavalent chromium, and has good heat resistance, moisture resistance and bondability with respect to a base material.

2. Description of the Related Art

A copper foil or a copper alloy foil (hereinafter, referred to simply as "copper foil") is widely used for the purpose of a conductor (conductive member or conductive strip). Particularly in the field of the flexible printed circuit (FPC), a printed circuit board is manufactured by layering (laminating) a copper foil on a polyimide film or by coating a copper foil with a varnish mainly composed of polyamic acid. Hereinafter, materials such as polyimide film, varnish, or solidified varnish to be used for the printed circuit board are referred as "base material (substrate) for a printed circuit board" or simply as "base material".

A good bonding is required between the copper foil and the base material for a printed circuit board. Therefore, the roughening treatment is frequently conducted for an bonding surface of the copper foil to increase an anchoring effect, thereby improving the bonding with the base material for a printed circuit board.

The copper foil is classified into an electro-deposited copper foil and a rolled copper foil according to the manufacturing method therefor. However, the roughening treatment is conducted in similar manner for these two types of copper foils. For example, as a manner of roughening treatment, a manner of applying (depositing) copper in the form of rice-grains on a surface of the copper foil by burnt plating and a manner of selectively etching grain boundaries by using acid are generally used.

As to the roughening treatment using the burnt plating, the roughening treatment by alloy platings has been developed in addition to the usual copper plating. Japanese Patent Laid-Open (Kokai) No. 52-145769 (JP-A-52-145769) discloses copper-nickel alloy plating as a representative example of alloy platings.

In addition, as to a surface treatment after such a roughening treatment, Japanese Patent Publication for Opposition (Kokoku) No. 6-54829 (JP-B-6-54829) proposes to provide a cobalt plating or cobalt-nickel alloy plating, etc.

On one hand, as to a method for improving the bonding with the base material, there is a method for providing an anchoring effect by using the roughening treatment (improvement in physical bondability), as described before. Further, there is also a step for improving a chemical bondability between the copper foil and the base material for a printed circuit board by a surface treatment for providing a metallic layer with a high affinity with the base material on a surface of the copper foil.

Conversion treatment such as so-called chromate treatment or silane-coupling treatment conducted for a surface of the copper foil is an example of the method for providing the metallic layer with the high affinity with the base material on the copper foil surface. The chromate treatment and silane-coupling treatment are methods for the purpose of rust preventing the surface of the copper foil as well as for the purpose of improving the bondability with the base material for a printed circuit board, as disclosed in Japanese Patent No. 3142259 and Japanese Patent Laid-Open (Kokai) No. 2005-8972 (JP-A-2005-8972). In addition, the rust prevention (corrosion resistance, oxidation resistance) effect is expected (required) also for the surface of the copper foil, which is a surface not to be bonded with the base material (the back side of the bonding surface).

As disclosed in the JP-B-6-54829, Japanese Patent No. 3142259, and JP-A-2005-8972, the chromate treatment has been conducted by immersing the copper foil to be treated in a treatment solution containing hexavalent chromium, or by electrolyzing the copper foil which is provided as an anode or a cathode in the chromate treatment solution. However, considering the recent emphasis on the environmental protection, the conversion treatment free of any hexavalent chromium has been developed.

As one of techniques therefor, a chromate treatment wherein a treating solution containing trivalent chromium is used exhibits the most remarkable actual achievement, and it becomes commercially available as shown in, for example, JP-A-2005-42139.

In reality, however, hexavalent chromium-free plating does not proceed in a manufacturing process of a copper foil, because its rustproof ability is usually inferior to a chromate treatment wherein a treating solution containing hexavalent chromium is used as compared with that of hexavalent chromium-free treating solution, besides there is a burden share for changing facilities.

In addition, there is another reason for preventing progress in a trivalent chromium treatment in that a coating weight of hexavalent chromium per unit area in a copper foil used in a printed circuit board is essentially very small, so that it is difficult to detect as a result of analysis.

According to a chromate treatment wherein a conventional treating solution containing hexavalent chromium is used, however, it cannot be denied that there is a possibility of providing totally a significant load to environment, even if it is a very small amount of coating weight in a present situation where a demand of a copper foil increases from year to year.

SUMMARY OF THE INVENTION

It is an object of the invention to provide a copper foil for a printed circuit board that contains no hexavalent chromium, and has good heat resistance and moisture resistance (rustproof ability) as well as good bonding strength to a base material for the printed circuit board.

According to the present invention, a copper foil for a printed circuit board comprises:

a rust preventing layer formed by a trivalent chromium chemical conversion treatment on a surface of the copper foil that the copper foil is bonded to a base material for the printed circuit board, wherein the copper foil comprises copper or copper alloy, and the rust preventing layer comprises 0.5 to 2.5 µg/cm² of chromium converted into metallic chromium.

The following modifications may be made in the invention.

(i) It is preferred that the copper foil for the printed circuit board further comprises:

an alloy plating layer formed under the rust preventing layer, wherein the alloy plating layer comprises nickel and cobalt the total amount of which is 5 to 20 µg/cm², and the alloy plating layer comprises cobalt whose concentration in the alloy plating layer is 60 to 80% by mass.

(ii) It is preferred that the copper foil for the printed circuit board further comprises:

a zinc galvanized layer formed under the rust preventing layer, wherein the zinc galvanized layer comprises 0.5 to 3 µg/cm² of zinc.

(iii) It is preferred that the copper foil for the printed circuit board further comprises:

a zinc galvanized layer formed between the rust preventing layer and the alloy plating layer, wherein the zinc galvanized layer comprises 0.5 to 3 µg/cm² of zinc.

(iv) It is preferred that the copper foil for the printed circuit board further comprises:

a roughening treatment layer formed under the alloy plating layer; and a copper plating treatment layer formed under the roughening treatment layer so as to smoothen the surface of the roughening treatment layer, or a copper plating treatment layer that is formed on the roughening treatment layer and has a uniform thickness along a roughened pattern of the roughening treatment layer.

(v) It is preferred that the copper foil for the printed circuit board further comprises:

a silane coupling treatment layer formed on the rust preventing layer, wherein the silane coupling treatment layer is made by heating and drying a silane coupling treating agent at a temperature of 150 to 300° C.

BRIEF DESCRIPTION OF THE DRAWINGS

The present invention will be explained in more detail in conjunction with appended drawings, wherein.

DESCRIPTION OF THE PREFERRED EMBODIMENTS

Preferred embodiments of the present invention will be described hereinafter by referring to the accompanying drawings.

(Structure of a Copper Foil for a Printed Circuit Board)

Figure 1:
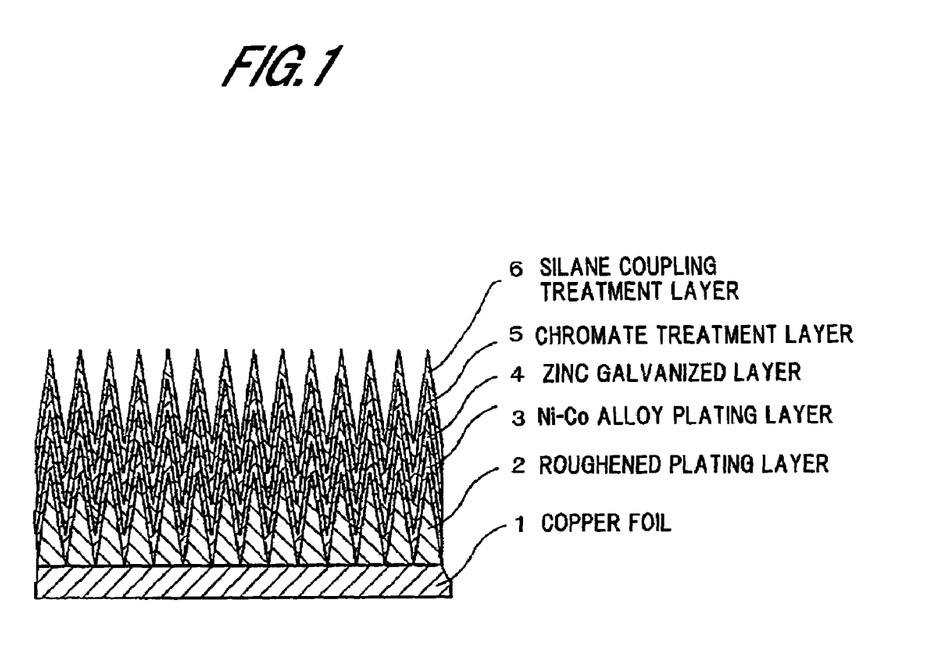
FIG. 1 is a pattern diagram, in a cross section, showing a constitution of a copper foil according to an embodiment of the invention.

FIG. 1 is a cross sectional schematic view showing a structure of a copper foil for a printed circuit board in a preferred embodiment according to the present invention.

On a copper foil 1, a roughened plating layer 2 is formed on a surface of the copper foil 1 to be bonded with a base material for a printed circuit board. A Ni—Co alloy plating layer 3, a zinc galvanized layer 4, a chromate treatment layer (trivalent chromate conversion layer) 5, and a silane coupling treatment layer 6 are successively formed on the roughened plating layer 2 to have a layered (laminated) structure. In the present invention, either an electro-deposited copper foil or a rolled copper foil may be used for the copper foil 1. In addition, although they are not shown in the drawings, it is preferable to further provide a Ni—Co alloy plating layer, a zinc galvanized layer, and a trivalent chromate treatment layer on another surface of the copper foil 1, so as to realize the rust prevention (corrosion resistance, oxidation resistance) effect. Herein, another surface of the copper foil 1 is not bonded to the base material (i.e. a back surface of the bonding surface), and is a non-roughened surface, to which a copper roughened plating treatment is not conducted.

(Roughening Treatment)

In the present invention, the roughening treatment may be or may not be conducted for the copper foil 1. However, it is preferable to conduct the roughening treatment. The roughening treatment is usually conducted by selective etching of a grain boundary of the copper foil 1 or by burnt plating of a copper or copper alloy. Japanese Patent No. 3142259 discloses an example of the roughening treatment conducted by the burnt plating.

In the roughening treatment by the plating, a small amount of a metal element other than copper may be doped. An example of the surface roughening treatment method to be conducted to the copper foil for a printed circuit board is explained below. A plating bath is an acidic copper plating bath mainly composed of a copper sulfate and a sulfuric acid, to which at least one metal selected from the group consisting of iron, nickel, cobalt, molybdenum, tungsten, titanium, and aluminum and an organic compound such as gelatin are doped. The electrolytic treatment is conducted for a bonding surface of the copper foil 1 with an electric current having a current density greater than a critical current density, so as to form a dendritic copper electro-deposited layer. The electrolytic treatment is further conducted for the dendritic copper electro-deposited layer formed on the copper foil 1 with an electric current having a current density less than the critical current density, so as to transform the dendritic copper into a nodulus copper.

As optimum condition in this method, for example, a doping amount of at least one selected from the group consisting of iron, nickel, and cobalt is 1 to 10 g/L, a doping amount of at least one selected from the group consisting of the molybdenum and tungsten is 0.1 to 1 g/L, a doping amount of at least one selected from the group consisting of the titanium and aluminum is 0.01 to 5 g/L, and a doping concentration of the gelatin is 0.1 to 1000 ppm.

As an example, the electrolytic treatment is conducted by using the plating bath doped with 28 g/L of copper, 125 g/L of sulfuric acid, 4 g/L of iron, 0.3 g/L of molybdenum, and 0.3 ppm of tungsten is used, at a solution temperature of 40° C. The dendritic copper electro-deposited layer is formed by using the current with a current density of 40 to 50 A/dm² for a treatment time of 3 to 5 seconds. Following the aforementioned roughening treatment, a copper plating layer with a uniform thickness may be provided along the roughened contour, so as to control convexo-concave profile of the surface (i.e. to prevent undesired change of the convexo-concave profile or to prevent the loss of convex portions).

In case of using the rolled copper foil, the copper plating may be applied prior to the roughening treatment for removing the irregularity of the surface of the rolled copper foil, to smoothen the surface. A thickness of the resulting copper plated layer is preferably 1 μm or more and less than 5 μm. The electrolytic treatment in the copper plating bath is preferably conducted under the conditions where the plating bath is composed of 120 to 200 g/L of copper sulfate, 70 to 150 g/L of sulfuric acid, and 30 to 150 ppm of gelatin, and the current density is 1 to 5 A/dm$^2$.

(Trivalent Chromate Treatment)

The present invention is in that a desired copper foil for printed circuit board is obtained by determining and controlling an amount of chromium to be applied (plated) being sufficient for exhibiting a rust preventing ability suitable for a printed circuit board use application in case of using a trivalent chromium chemical conversion treating solution.

As a trivalent chromium conversion treatment solution used for the trivalent chromate treatment, it is preferable to use an aqueous solution substantially free of hexavalent chromium ion and containing the trivalent chromium ions. The trivalent chromium ion contained in this solution is, as converted into metal chromium, 70 mg/L or more and less than 500 mg/L, preferably 110 mg/L or more and 400 mg/L or less, and more preferably 150 mg/L or more and 300 mg/L or less. The pH-value of this solution ranges from 3.0 to 4.5, preferably from 3.5 to 4.0, and more preferably from 3.6 to 3.8. If the pH-value is greater than 4.5 (pH>4.5), the stability (solubility) of chromium ions in the plating solution will be decreased, and the chromium ions will be easily deposited or precipitated in form of hydroxides. Therefore, it becomes difficult to control the formation of the chromium film (coating).

By setting the trivalent chromium ionic concentration of the trivalent chromium conversion treatment solution within a range from 70 to 500 mg/L and setting pH-value of the plating solution as high as possible but in a range where the plating solution will not become unstable (unexpected deposition will not be produced), it is possible to realize the trivalent chromium conversion treatment solution for providing the copper foil for a printed circuit board having an excellent controllability of Zn film forming amount and chromate film forming amount. It is most preferable to use the trivalent chromium conversion treatment solution having a trivalent chromium ion concentration ranging from 150 to 300 mg/L and pH-value of 3.8 (the upper limit of pH-value is 3.8, and a control range of pH-value is 3.6 to 3.8). By using this trivalent chromium conversion treatment solution, the controllability of Zn film forming amount and chromate film forming amount (film thickness) can be significantly improved. Further, for the environmental protection and reduction in the fabrication cost, it is preferable to use the solution free of fluoride ion.

The trivalent chromium ions may be provided from either of nitric acid chromium, chromium sulfate, and chromium chloride.

For decreasing the pH-value (i.e. increasing a degree of acidity) of the conversion treatment solution, it is preferable to use the aqueous nitric acid solution. On the other hand, for increasing the pH-value (i.e. decreasing the degree of acidity) of the conversion treatment solution, it is preferable to use the aqueous sodium hydroxide solution. The conversion treatment is conducted by immersing the copper foil 1 in the treatment solution. The treatment temperature is preferably around a room temperature (around 15 to 40° C.). A treatment time is not limited to a particular time period. However, it is preferable to adjust the treatment time within a range of 1 to 20 seconds, with considering the speed of manufacture line.

It is preferred that an amount of chromium to be plated is 0.5 μg/cm$^2$ or more to 2.5 μg/cm$^2$ or less converted into metallic chromium. More preferable is 0.5 μg/cm$^2$ or more to 2.0 μg/cm$^2$ or less, and still further preferable is 0.7 μg/cm$^2$ or more to 1.5 μg/cm$^2$ or less. When the amount of chromium to be plated is less than 0.5 μg/cm$^2$, a rust preventing ability such as resistance to discoloration due to oxidation, and resistance to discoloration due to moisture is insufficient.

Figure 2:
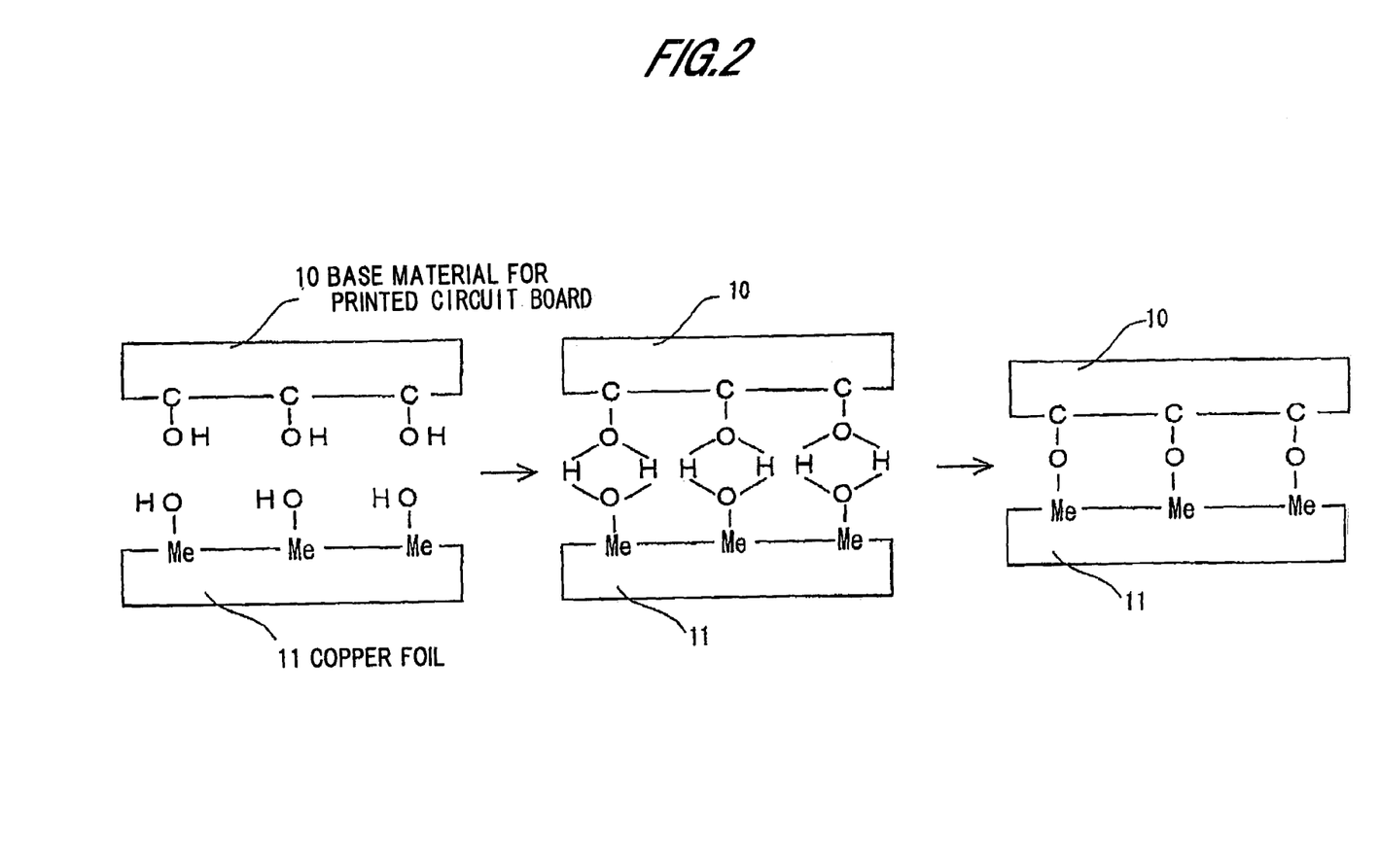
FIG. 2 is a view illustrating a behavior model of an interface in a bonding between a copper foil and a base material for printed circuit board.

FIG. 2 is a diagram showing a behavior model of an interface in bonding between the copper foil and the base material for a printed circuit board. In strict, the interface may be affected by ions existing in vicinity of the interface or additives included in the base material 10 for a printed circuit board, other than a binding reaction as shown in FIG. 2. However, the effect of these elements is ignored here.

It is assumed that the chromium coating made by the conversion treatment is composed of a mixture of metallic chromium, chromium hydroxide, and chromium oxide. Further, it is believed that hydroxyl group (i.e. OH group, which is represented by the chromium hydroxide) plays an important role in the bonding with the base material and in the silane coupling treatment as explained later.

It is assumed that the bonding of a copper foil 11 with the base material 10 for a printed circuit board is conducted as follows. OH groups at a surface of the copper foil 11 move close enough to the OH groups at a surface of the base material 10 for a printed circuit board, so that the hydrogen bonding occurs firstly. At the time of a heating step in a pressing process or resin curing process that is successively conducted, a dehydration occurs at a hydrogen bonding part, so that the copper foil 11 and the base material 10 are covalently bonded. As a result, the bonding force (binding power) becomes strong. However, when a coating amount of the chromium exceeds 2.5 μg/cm$^2$, the chromium layer itself becomes thick and fragile, therefore an exfoliation (peeling) in the chromium layer easily occurs. As a result, the bonding force with the copper foil 11 is decreased.

(Pretreatment of the Trivalent Chromate Treatment)

Referring again to FIG. 1, the pretreatment of the trivalent conversion treatment will be explained.

Prior to the trivalent chromate treatment, it is preferable to provide a Ni—Co alloy plating. The Ni—Co alloy plating is generally carried by a following method. Cobalt salt is dissolved with a constant concentration in a nickel-plating solution such as Watt-type plating bath or sulfamate plating bath, and nickel and cobalt are simultaneously electrodeposited by a galvanic electroplating treatment.

The Ni—Co alloy plating layer 3 suppresses the alloying of the copper foil 1 and zinc galvanized layer 4 described later. When the copper and zinc diffuses to form an alloy layer (brass layer), the exfoliation (peeling) will easily occur at an interface of the copper and brass as well as the rust prevention effect will decrease. Although either nickel or cobalt alone plating has an effect of preventing a discoloration due to oxidation and an effect of preventing discoloration due to moisture by itself, these effects can be improved in the Ni—Co alloy plating.

It is considered that the cobalt functions like a so-called catalyst, i.e. function to activate a reaction of a polyimide, particularly when the polyimide is employed as a base material for a printed circuit board to be bonded. In addition, it is found that alkali etching characteristics are improved by the use of the Ni—Co alloy in comparison with those of the nickel-plating alone.

The coating amount of the Ni—Co plating is preferably 5 µg/cm$^2$≦Ni+Co≦20 µg/cm$^2$, and a cobalt concentration in the coating is desirably 60 mass % or more and 80 mass % or less, preferably 65 mass % or more and 75 mass % or less, and more preferably 70 mass % or more and 75 mass % or less. When the cobalt concentration is less than 60 mass %, the bondability with the base material for a printed circuit board is decreased. On the contrary, even if the cobalt with a concentration greater than 80 mass % is doped, the bonding with the base material for a printed circuit board does not substantially change, and it becomes disadvantageous from the point of view of manufacturing cost, since the cobalt is very expensive in comparison with the nickel.

An example of the treatment condition for the Ni—Co plating will be shown below.

Nickel: 78 g/L
Cobalt: 20 g/L
Solution temperature: 40° C.
pH-value: 4.3 to 4.5
Current density: 1.0 to 3.0 A/dm$^2$
Treatment time: 2 to 5 seconds After providing the Ni—Co alloy plating, the zinc galvanized layer is provided as an underlying layer for the trivalent chromate treatment. The zinc galvanized layer functions to assist a formation of the chromium coating as well as functions as a rust prevention layer for the copper foil 1.

It is preferable that the coating amount of zinc is 0.5 µg/cm$^2$ or more and 3 µg/cm$^2$ or less. There is such a tendency that if the trivalent chromate treatment condition after the formation of the zinc galvanized layer 4 is identical, the chromium coating amount increases in accordance with the increase of the zinc galvanized coating amount. The detail thereof will be described later. However, it is thought that the formation of the chromium coating is realized by the competitive relationship between the dissolution (elution) of the zinc galvanized layer (underlying layer) 4 and the bonding (deposition) of the chromium coating. In other words, it is required to control the concentration and pH-value of the trivalent chromium conversion treatment solution as well as to control the coating amount of the zinc galvanization, so as to control the aforementioned competition, for obtaining the most suitable chromium coating amount.

If the coating amount of the zinc galvanization is less than 0.5 µg/cm2, the zinc galvanized layer 4 does not function as the rust prevention layer and the control of the chromium coating amount will become difficult. On the other hand, if the coating amount of the zinc galvanization is greater than 3 µg/cm$^2$, where a printed circuit board is formed by bonding the zinc galvanized layer 4 to the base material for a printed circuit board to and a circuit is formed by etching, there will arise another problem that the zinc exposed at side surfaces of the circuit will be easily eluted by hydrochloric acid or electroless tin plating solution used during the manufacturing process of the printed circuit board. Therefore, there is a disadvantage in that the bonding force is deteriorated due to the decrease of an area bonded to the base material for a printed circuit board.

Figure 3:
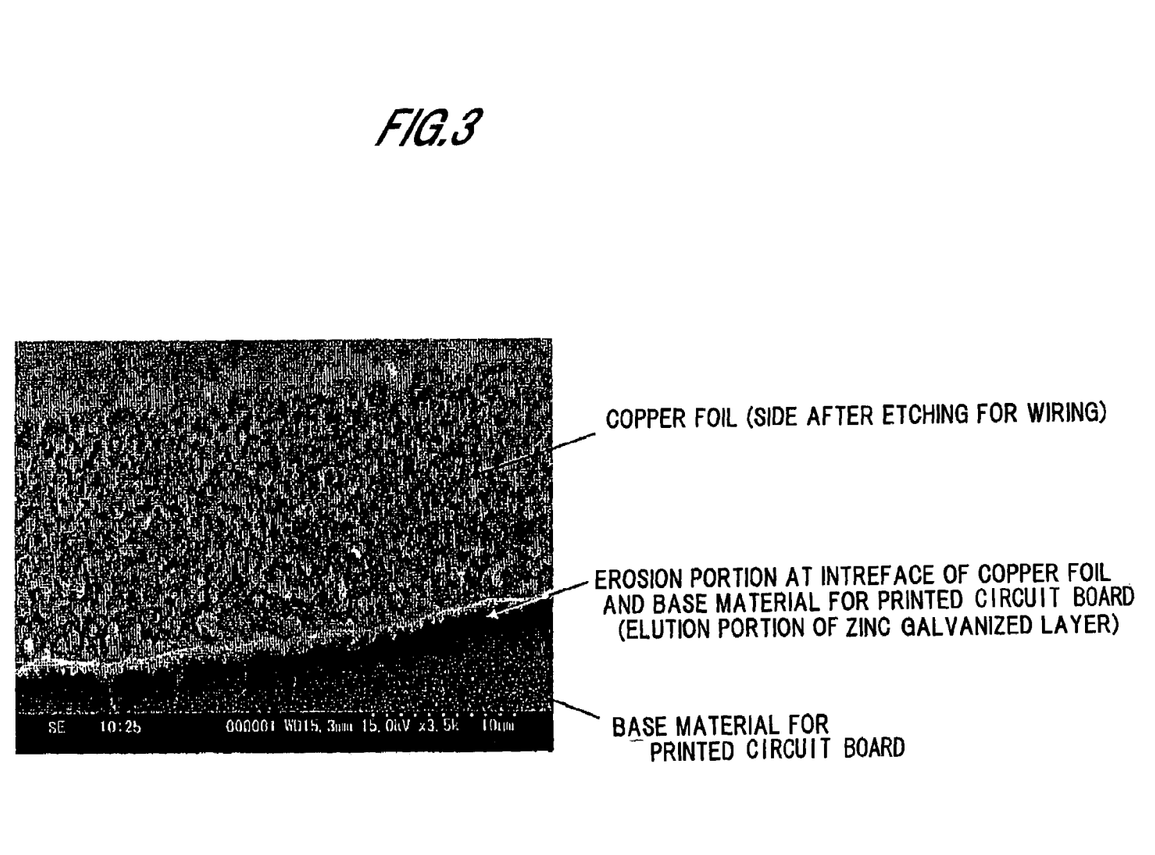
FIG. 3 is a photograph indicating results observed by means of a scanning electron microscope (SEM) wherein such a condition that a zinc galvanized layer applied to a copper foil is dissolved by an electroless tin plating solution, whereby the interface between the copper foil and a base material for printed circuit board is exfoliated (a gap appears) is shown.

FIG. 3 is a photograph indicating results observed by means of a scanning electron microscope (SEM) wherein such a condition of an interface section (a zinc galvanized layer) between the copper foil and a base material for printed circuit board which is eroded by an electroless tin plating solution is shown.

From the photograph, it is ascertained that since the zinc galvanized layer positioned in the interface section between a copper foil (a side after etching for a wiring) occupying the upper part of photograph and a base material for printed circuit board occupying the lower part of the photograph is eluted (eroded) as mentioned above, a situation wherein a circuit part of the copper foil is in an overhung condition (undercut phenomenon), and thus, decrease in bonding strength seems to appear.

At this time, the reason why the electroless tin plating is provided is as follows. In the manufacturing process of the printed circuit board, it is required to provide the tin plating which is excellent in the corrosion resistance and solder wettability at a portion connected with other printed circuit boards or electronic members as a connector, or at a solder-bonded portion, following the etching of the copper foil 1 to form the circuit.

Next, an example of the treatment condition for the zinc galvanization will be shown below.

Zinc: 20 g/L
Solution temperature: 17° C. to 22° C.
pH-value: 2.8 to 3.0
Current density: 0.3 to 1.5 A/dm$^2$
Treatment time: 2 to 5 seconds (Silane Coupling Treatment)

For further improving the bonding strength, the silane coupling treatment is conducted following the aforementioned pretreatment to the surface of the copper foil 1 bonded to the base material for a printed circuit board. Although, various kinds of the silane coupling treatment agents are commercially available, since the treatment agent are respectively characterized, it is required to select a treatment agent suitable for the base material for a printed circuit board to be bonded. In particular, when a polyimide is employed as the base material for a printed circuit board, it is effective to use amino silane, preferably aminopropyl-trimethoxysilane as the silane coupling treatment agent.

The silane coupling treatment is conducted by immersing the copper foil 1 in the silane coupling treatment solution. In this treatment, it is considered that silanols in the aqueous solution are adsorbed to the OH groups, which mainly exists on a trivalent chromate treatment layer 5 formed on the copper foil 1 or a surface of the underlying metallic layer (zinc galvanized layer 4), so that the silanols are hydrogen bonded thereto.

Following the silane coupling treatment, a drying treatment is promptly conducted. At this time, the hydrogen bonded silanols and hydrogen-bonding parts of the trivalent chromate treatment layer 5 are dehydrated, and heated with a heat (thermal energy) necessary for covalently bonding the hydrogen bonding parts. The hydrogen bonding should be changed to the covalent bonding, a bonding energy is low if the bonding remains in the form of hydrogen-bonding and the effects of the silane coupling treatment cannot be obtained in the hydrogen bonding. On the other hand, if the bonded silanols are heated too much, they will be decomposed by heat. The decomposed parts will become a fragile interface and adversely affect the bonding with the base material for a printed circuit board. Therefore, it is unfavorable to heat the bonded silanols too much.

A drying temperature and a drying time depend on a device configuration and a processing speed of the manufacturing process (work time). A preferable range of the drying temperature is 150 to 300° C., and a preferable range of the drying time is 15 to 35 seconds.

In the following, the invention is specifically described in conjunction with examples, but it is to be noted that the invention is not limited thereto.

EXAMPLE 1

(Evaluation of Peel Strength Based on Amount of Chromium Plated)

A rolled copper foil having 16.3 µm thickness is subjected to an electrolytic degreasing treatment by cathode electrolysis in an aqueous solution of 40 g/L sodium hydroxide and 20 g/L sodium carbonate at 40° C. temperature and 5 A/dm$^2$ current density for 10 second treating time, and is subjected to an acid-pickling treatment by immersing the copper foil degreased into an aqueous solution of 50 g/L sulfuric acid at 25° C. temperature for 10 seconds treating time.]

The resulting copper foil is subjected to a roughening treatment, the treatment is carried out by using a plating bath prepared from 30 g/L copper, 130 g/L sulfuric acid, 5 g/L iron, 0.5 g/L molybdenum, 0.01 g/L titanium, and 0.01 ppm gelatin in a condition of 40° C. solution temperature, and 40 A/dm$^2$ current density for forming an arborescens copper electro-deposited layer for 3 seconds treating time. Thereafter, galvanization is made with a predetermined amount of raw materials so as to have 1.0 µg/cm$^2$ plated amount after chemical conversion treatment, and the resulting copper foil is successively immersed as it is in a trivalent chromium chemical treating solution in a condition (solution composition) shown in Table 1. All the immersion conditions are such that a pH=3.7, a solution temperature is room temperature (approximately 25° C.), an immersion temperature is 10 seconds wherein an adjustment of the pH is implemented by addition of sodium hydroxide or nitric acid.

A method for measuring an amount of each metal plated will be described herein wherein a film is acid-dissolved, and then, the resulting solution is measured by inductively coupled plasma atomic emission spectroscopy (ICP-AES). First, a copper foil is cut out into a piece having 40 mm×100 mm, and an adhesive tape is sufficiently bonded to a side reverse of a surface to be measured. This is because only the surface to be measured is allowed to dissolve in case of the undermentioned acid dissolution. For the acid dissolution, an aqueous nitric acid solution prepared by mixing nitric acid in a volume ratio of 1 (60 to 61% by mass, 1.38 specific gravity) with pure water of 9 (hereinafter referred to as "(1+9) nitric acid") is used. A treated film on the surface of the copper foil is dissolved by using 30 ml of the (1+9) nitric acid, and the copper foil is taken out. Then, pure water is added to the solution to obtain 100 mL of an aqueous solution. A metal concentration of the resulting solution is measured by ICP-AES.

In accordance with the above-described measuring method, an amount of chromium (Cr) plated on the copper foil is measured, and the measured results are shown also in Table 1.

In order to estimating a chromium film, a peel strength (bond strength to a base material) is measured with respect to a product obtained by bonding a copper foil to which trivalent chromium chemical conversion treatment has been applied in each condition shown in Table 1 to a polyimide film (base material) in accordance with JIS C6481, and the results measured are shown also in Table 1.

Moreover, a circuit is formed on each of these samples with ferric chloride etching, and then heat-treated at 150° C.×168 hours in the atmosphere as an accelerated test for evaluating a degree of discoloration resistant to oxidation (rust preventing ability).

A peel strength of each sample after heat treatment is measured, and a retention resistant to heat (=peel strength after heating/peel strength before heating×100)(%) is determined as a ratio with respect to the peel strength before heating, and the results obtained are also shown in Table 1.

TABLE 1

Relationship between trivalent chromium chemical conversion treating condition (amount of Cr plated) and peel strength

| | Solution composition | | Amount | | |
|---|---|---|---|---|---|
| | Trivalent chromium (g/L) | Nitric Acid (g/L) | of Cr Plated (µg/cm$^2$) | Peel Strength (N/mm) | Retention Resistant to Heat (%) |
| Example 1 | 0.15 | 0.25 | 0.9 | 0.644 | 90 |
| Comparative example 1 | 0.9 | 1.50 | 3.8 | 0.467 | 90 |
| Comparative example 2 | 0.03 | 0.05 | 0.1 | 0.610 | 77 |

As is apparent from Table 1, it is confirmed that its peel strength decreases remarkably in comparative example 1 wherein an amount of chromium plated is more than 2.5 µg/cm$^2$ (converted into metallic chromium) as compared with example 1. This result is considered to be in that since a thick chromium layer is formed, it becomes fragile, so that exfoliation occurs easily in the chromium layer as mentioned above.

On one hand, it is confirmed that a retention resistant to heat deteriorates remarkably in addition to decreased peel strength in comparative example 2 wherein an amount of chromium plated is less than 0.5 µg/cm$^2$ as compared with example 1. The result is considered to be in that oxidation appears in an interface between a copper foil and polyimide due to insufficient resistance to oxidation in the chromium layer, whereby the sample of comparative example 2 becomes fragile (exhibits a decreased bonding strength).

EXAMPLE 2

(Evaluation of Peel Strength Based on Differences in Amount of Metal Plated)

A rolled copper foil being 16.3 µm in thickness as in the case of example 1 is subjected to an electrolytic degreasing treatment, and an acid-pickling treatment. Thereafter, the copper foil thus treated is subjected consecutively to a roughening treatment, nickel-cobalt alloy plating, galvanization, and a trivalent chromium chemical conversion treatment, whereby samples each having a film as shown in Table 2 are prepared.

Each amount of nickel, cobalt, zinc, and chromium plated on a surface of the copper foil is measured in accordance with the same manner as that described in example 1 by using an ICP-AES. As comparative examples, an example wherein a sample contains more than 20 µg/cm$_2$ of an Ni+Co amount plated (comparative example 3), an example wherein a sample has less than 60% by mass (mass %) of a cobalt concentration in its nickel-cobalt alloy plating layer (comparative example 4), and an example wherein although its nickel-cobalt alloy plating layer is in an adequate range, an amount of chromium plated is more than 2.5 µg/cm$^2$ (comparative example 5) are prepared.

Each of these samples is bonded together with a polyimide film, and a circuit is formed on the sample thus bonded with a ferric chloride etching, and peel strength is measured with respect to the sample as in example 1, the results thereof are shown also in Table 2.

TABLE 2

Relationship between amount of metal plated on copper foil surface and peel strength

| | Amount of Ni + Co plated ($\mu g/cm^2$) | Co concentration (mass %) | Amount of Zn plated ($\mu g/cm^2$) | Amount of Cr plated ($\mu g/cm^2$) | Peel strength (N/mm) |
|---|---|---|---|---|---|
| Example 2 | 9.7 | 70 | 0.9 | 0.9 | 0.694 |
| Comparative example 3 | 23 | 72 | 2.0 | 2.6 | 0.550 |
| Comparative example 4 | 10.3 | 55 | 2.1 | 2.8 | 0.530 |
| Comparative example 5 | 8.2 | 62 | 2.8 | 3.0 | 0.497 |

As shown in Table 2, peel strength in example 2 is higher than that of example 1. In this respect, it is found that when a nickel-cobalt alloy plating layer is controlled adequately, a higher characteristic copper foil for printed circuit board is obtained. From the fact that the peel strength of example 2 exhibits a higher value than those of comparative examples 3 to 5, it becomes clear that control for the nickel-cobalt alloy layer is important in addition to control of an amount of chromium plated.

EXAMPLE 3

(Evaluation of Retention Resistant to Tin Plating Based on Differences in Amounts of Zinc Plated)

Electroless tin plating treatment is applied to the sample of Example 2 after a circuit is formed thereon by etching (example 3), and peel strength is measured. As an index for estimating a bonding strength in a printed circuit board mentioned above, a retention resistant to tin plating (=peel strength of a sample to which tin plating is applied/peel strength to which tin plating is not applied×100) (%) is determined in a ratio with respect to a peel strength of a sample to which electroless tin plating treatment is applied.

A treating condition for electroless tin plating is such that a plating solution (trade name: "SHIPLEY THINPOSIT LT34A" manufactured by Shipley Far East Co., Ltd.) is used at a temperature of 70° C. for an immersion time of 5 minutes.

On one hand, an example wherein a sample having an amount of zinc (Zn) plated of more than 3 $\mu g/cm^2$ is provided, on which a circuit is formed, and then, electroless tin treatment is applied thereto in accordance with the same manner as that of the above example 3 is prepared as a comparative example (comparative example 6). A retention resistant to tin plating (%) is evaluated in a ratio with respect to a peel strength of a sample to which electroless tin plating treatment is not applied.

Results of an amount of each metal plated and a retention resistant to tin (Sn) plating are shown in Table 3.

TABLE 3

Relationship between Amount of Zinc Plated on Copper Foil Surface and Retention Resistant to Tin Plating

| | Amount of Ni + Co plated ($\mu g/cm^2$) | Co concentration (mass %) | Amount of Zn plated ($\mu g/cm^2$) | Amount of Cr plated ($\mu g/cm^2$) | Retention resistant to Sn plating (%) |
|---|---|---|---|---|---|
| Example 3 | 9.7 | 70 | 0.9 | 0.9 | 88 |
| Comparative example 6 | 10.8 | 70 | 4.1 | 3.9 | 49 |

As is apparent from Table 3, the retention resistant to tin plating of example 3 exhibits a very good result to that of comparative example 6. Accordingly, it may be concluded that a further control of an amount of Zn plated is important in addition to a control of an amount of chromium plated. It is considered in comparative example 6 that a retention resistant to tin plating decreases remarkably due to the fact that a Zn plating layer is eroded in case of forming a circuit by etching, whereby the circuit part of the copper foil is in an overhung condition (undercut phenomenon) as shown in FIG. 3 in addition to a presence of an excessive amount of chromium plated.

EXAMPLE 4

(Evaluation of Peel Strength Based on Differences in Drying Conditions After Silane Coupling Treatment)

The same treatment as that of example 2 is implemented, a trivalent chromium chemical conversion treatment is applied, and then, a silane coupling treatment is conducted. An aqueous solution of aminopropyl trimethoxy silane is used as a silane coupling treating agent at room temperature for ten seconds of immersion. A sample wherein a treatment is conducted at a drying temperature of 200° C. for a drying time of 30 seconds (example 4-1), and an another sample wherein a treatment is conducted at a drying temperature of 300° C. for a drying time of 30 seconds (example 4-2) are prepared. As comparative examples, a sample wherein a drying time is reduced (comparative example 7), while a sample wherein drying is conductive at a high temperature for a long period of time (comparative example 8) are prepared.

Each of these samples is bonded together with a polyimide film, a circuit is formed with ferric chloride etching, and then, peel strength is measured. Results of peel strength are shown in Table 4 together with its drying conditions.

TABLE 4

Relationship between drying condition after silane coupling treatment and peel strength

| | Drying temperature (° C.) | Drying time (sec) | Peel strength (N/mm) |
|---|---|---|---|
| Example 4-1 | 200 | 30 | 0.900 |
| Example 4-2 | 300 | 15 | 0.750 |
| Comparative example 7 | 200 | 10 | 0.573 |
| Comparative example 8 | 350 | 60 | 0.550 |

As is apparent from Table 4, examples 4-1 and 4-2 exhibit very good peel strengths as compared with those of comparative examples 7 and 8, and exhibit further good results in comparison with those of examples 1 and 2. Accordingly, this means that the optimum combinations are obtained as to drying temperatures and drying times in examples 4-1 and 4-2. In other words, it is found that when silane coupling treatment and the drying condition therefor are controlled, higher characteristic copper foil for printed circuit board is obtained.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A copper foil for a printed circuit board, comprising:
   a rust preventing layer formed by a trivalent chromium chemical conversion treatment on the copper foil; and
   an alloy plating layer formed under the rust preventing layer,
   wherein the copper foil comprises copper or copper alloy,
   the rust preventing layer comprises 0.5 to 2.5 μg/cm² of chromium,
   the alloy plating layer comprises nickel and cobalt, the total amount of which is 5 to 20 μg/cm², and
   the alloy plating layer comprises cobalt whose concentration in the alloy plating layer is 60 to 80% by mass.

2. The copper foil for the printed circuit board according to claim 1, further comprising:
   a zinc galvanized layer formed between the rust preventing layer and the alloy plating layer,
   wherein the zinc galvanized layer comprises 0.5 to 3 μg/cm² of zinc.

3. The copper foil for the printed circuit board according to claim 1, further comprising:
   a roughening treatment layer formed under the alloy plating layer; and
   a copper plating treatment layer formed under or on the roughening treatment layer.

4. The copper foil for the printed circuit board according to claim 2, further comprising:
   a roughening treatment layer formed under the alloy plating layer; and
   a copper plating treatment layer formed under or on the roughening treatment layer.

5. The copper foil for the printed circuit board according to claim 1, further comprising:
   a silane coupling treatment layer formed on the rust preventing layer,
   wherein the silane coupling treatment layer is made by heating and drying a silane coupling treating agent at a temperature of 150 to 300° C.

6. A copper foil for a printed circuit board, comprising:
   a rust preventing layer formed by a trivalent chromium chemical conversion treatment on the copper foil; and
   an alloy plating layer formed under the rust preventing layer,
   wherein the copper foil comprises at least one of copper and copper alloy,
   the alloy plating layer comprises nickel and cobalt, the total amount of which is 5 to 20 μg/cm², and
   the alloy plating layer comprises cobalt whose concentration in the alloy plating layer is 60 to 80% by mass.

7. The copper foil for the printed circuit board according to claim 6, further comprising:
   a zinc galvanized layer formed between the rust preventing layer and the alloy plating layer,
   wherein the zinc galvanized layer comprises 0.5 to 3 μg/cm² of zinc.

8. The copper foil for the printed circuit board according to claim 6, further comprising:
   a roughening treatment layer formed under the alloy plating layer; and
   a copper plating treatment layer formed at least one of under and on the roughening treatment layer.

9. The copper foil for the printed circuit board according to claim 7, further comprising:
   a roughening treatment layer formed under the alloy plating layer; and
   a copper plating treatment layer formed at least one of under and on the roughening treatment layer.

10. The copper foil for the printed circuit board according to claim 6, further comprising:
    a silane coupling treatment layer formed on the rust preventing layer,
    wherein the silane coupling treatment layer is made by heating and drying a silane coupling treating agent at a temperature of 150 to 300° C.

* * * * *